United States Patent
Chou et al.

(10) Patent No.: US 6,599,793 B2
(45) Date of Patent: Jul. 29, 2003

(54) MEMORY ARRAY WITH SALICIDE ISOLATION

(75) Inventors: Ming-Hung Chou, Miaoli (TW); Jui-Lin Lu, Hsin-Chu (TW); Chong-Jen Huang, San-Chung (TW); Shou-Wei Hwang, Hsin-Chu (TW); Hsin-Huei Chen, Miao-Li (TW)

(73) Assignee: Macronix International Co., Ltd. (TW)

( * ) Notice: Subject to any disclaimer, the term of this patent is extended or adjusted under 35 U.S.C. 154(b) by 42 days.

(21) Appl. No.: 09/901,888

(22) Filed: May 31, 2001

(65) Prior Publication Data

US 2002/0182797 A1 Dec. 5, 2002

(51) Int. Cl.⁷ .......................................... H01L 21/8238
(52) U.S. Cl. ..................... 438/207; 438/241; 438/244; 438/360; 438/255; 438/258
(58) Field of Search ............................... 438/207, 241, 438/258, 244, 259, 250, 255, 265, 270, 315, 682, 684

(56) References Cited

U.S. PATENT DOCUMENTS

| 6,395,596 B1 * | 5/2002 | Chien et al. ................. 438/241 |
| 6,413,861 B1 * | 7/2002 | Huang et al. ................. 439/682 |
| 6,436,765 B1 * | 8/2002 | Liou et al. ................... 438/259 |

* cited by examiner

*Primary Examiner*—Hoai Ho
*Assistant Examiner*—Reneé R Berry

(57) ABSTRACT

The present invention provides a memory array fabricated by complementary metal-oxide-semiconductor salicide process. The memory array comprises a semiconductor substrate. Multitudes of first isolation devices are aligned in the semiconductor substrate and second isolation devices aligned on the semiconductor substrate. The alignment of the second isolation devices is parallel to one of the first isolation devices. Some polysilicon lines are on the second isolation devices therefor have null memory function. A conductive structure is below a surface of the semiconductor substrate. The conductive structure is located between the first isolation devices. A conductive contact is on the conductive structure. The correspondence of the first isolation devices and the polysilicon lines can prevent the conductive structures from short effect.

7 Claims, 2 Drawing Sheets

MEMORY ARRAY WITH SALICIDE ISOLATION

BACKGROUND OF THE INVENTION

1. Field of the Invention

The invention relates to memory array, and more particularly to memory array with salicide isolation.

2. Description of the Prior Art

In many applications, an electronic device includes a logic circuit device and a memory device, which are separately fabricated in different individual semiconductor substrates. As the technologies of semiconductor fabrication are further developed, a new trend has developed in which the logic circuit device and the memory device are fabricated in a single substrate so as to enhance the operation speed.

However, the fabrication processes for the logic device and the memory device are different. The logic device mainly used for a logic operation needs a fast data transmission speed, and therefore needs a self-aligned (Salicide), such as titanium silicide, formed over the interchangeable source/drain regions to reduce sheet resistance. The memory device mainly used for storing information data needs to avoid leakage current, which leakage current may cause a change of data, and so the interchangeable source/drain regions must not have silicide. Thus, layout of logic circuit device integrated with memory device in a single substrate needs to be modified when the conventional CMOS salicide process is applied.

Accordingly, it is important to prevent buried diffusion regions in the memory device from short effect and reduce loading of the memory cell for improving the performance thereof when the conventional CMOS self-aligned salicide process is applied on the fabrication of the memory array.

SUMMARY OF THE INVENTION

It is an object of the present invention to provide a memory array fabricated by complementary metal-oxide-semiconductor salicide process. The coordination of shallow trench isolation and LOCOS structure can prevent salicide from short.

It is another object of the present invention to provide a virtual ground flash memory fabricated by complementary metal-oxide-semiconductor salicide process. A conductive contact is periodically located on N+ diffusion region instead of buried diffusion oxide.

In the present invention, a memory array is fabricated by complementary metal-oxide-semiconductor salicide process. The memory array comprises a semiconductor substrate. Multitudes of first isolation devices are aligned in the semiconductor substrate and second isolation devices aligned on the semiconductor substrate. The alignment of the second isolation devices is parallel to one of the first isolation devices. Some polysilicon lines are on the second isolation devices therefor have null memory function. A conductive structure is below a surface of the semiconductor substrate. The conductive structure is located between the first isolation devices. A conductive contact is on the conductive structure. The correspondence of the first isolation devices and the polysilicon lines can prevent the conductive structures from short effect.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

While the invention is particularly shown and described with reference to the following preferred embodiment, it will be understood by those skilled in the art that many other modifications and variations may be made thereto without departing from the broader spirit and scope of the invention as set forth in the claims. Use of the disclosed structure or method is not limited to virtual ground flash memory arrays, but may also be used in fabricating other types of memory devices with equal architectures, such as a SONOS (Silicon-oxide-nitride-oxide-semiconductor) type memory array. The specification and drawings are according to be regarded as being illustrative, rather than being restrictive.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a memory array is fabricated by complementary metal-oxide-semiconductor salicide process. The memory array comprises a semiconductor substrate. Multitudes of first isolation devices are aligned in the semiconductor substrate and second isolation devices aligned on the semiconductor substrate. The alignment of the second isolation devices is parallel to one of the first isolation devices. Some polysilicon lines are on the second isolation devices therefor have null memory function. A conductive structure is below a surface of the semiconductor substrate. The conductive structure is located between the first isolation devices. A conductive contact is on the conductive structure.

Figure 1A:
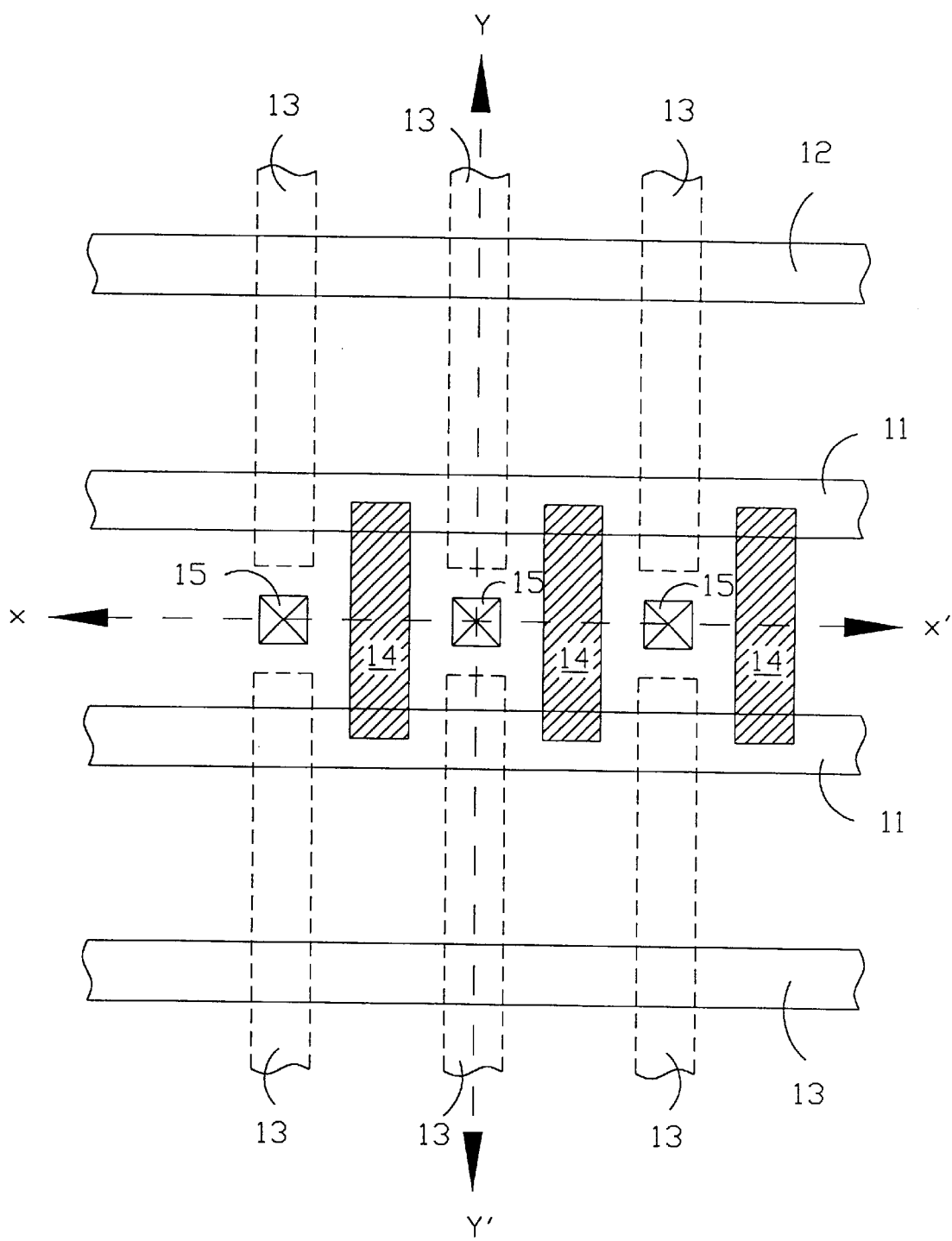
FIG. 1A is a layout representation of a virtual ground flash array comprising contact structures and isolation devices in the memory cell in accordance with the present invention.
Figure 1B:
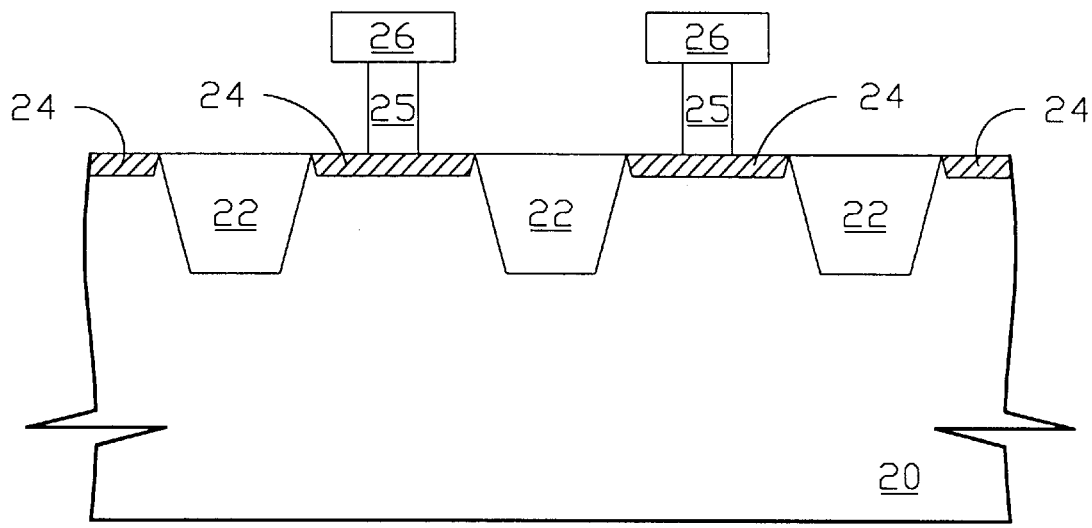
FIG. 1B is a cross-sectional representation of the virtual ground flash array layout taken along line X–X' in FIG. 1A.
Figure 1C:
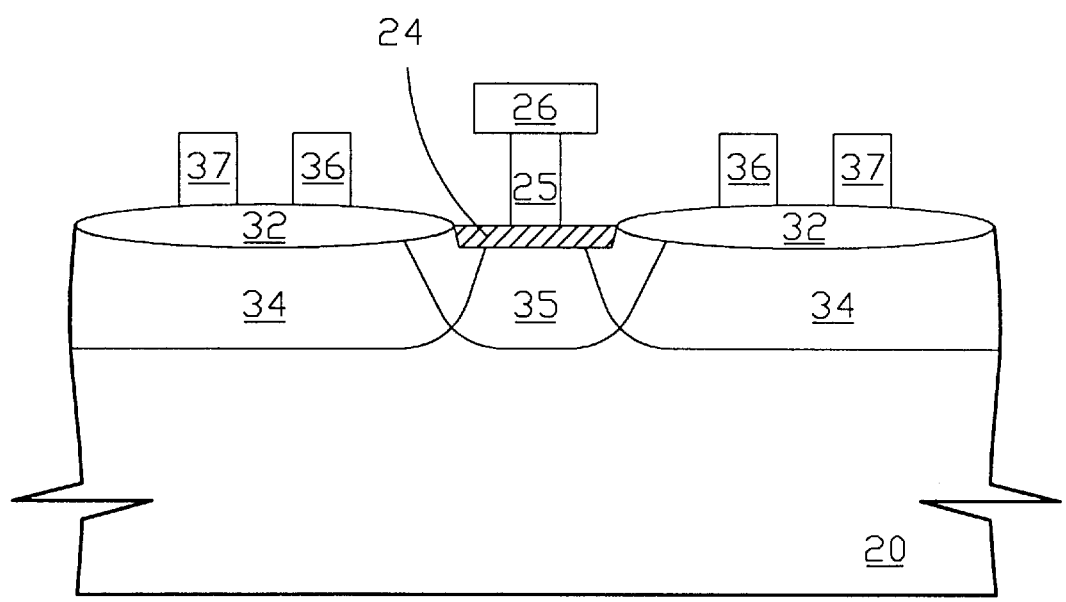
FIG. 1C is a cross-sectional representation of the virtual ground flash array layout taken along line Y–Y' in FIG. 1A.

One embodiment of the present invention is depicted in FIGS. 1A–1C. FIG. 1A is a schematic representation of a virtual ground flash array layout in accordance with the present invention. Conductive contacts 15 are periodically interposed among buried diffusion regions 13 for reducing resistance of buried diffusion regions 13. The conductive contacts 15 are isolated from each another by multitude of isolation devices 11. The isolation devices 11 are extended underlying dummy polysilicon lines 12. Furthermore, word lines 13 made of polysilicon material are parallel to the dummy polysilicon lines 12.

FIG. 1B shows a cross-sectional view of the virtual ground flash array layout taken along line X–X' in FIG. 1A. In FIG. 1B, a semiconductor substrate 20, such as a silicon substrate, is provided. The semiconductor substrate 20 may have a single-well or multi-well configuration (not shown) formed therein. A multitude of isolation devices 22, such as shallow trench isolation (STI) structures, are in the semiconductor substrate 20 thereby isolate conductive structures 24. As a key feature of the present invention, the isolation devices 22 are used to prevent the conductive structures 24 each another from short effects. In the embodiment, those conductive structures 24, such as titanium silicide, are formed by conventional self-aligned salicide process of CMOS. Furthermore, metal structures 26 are coupled to the conductive devices 24 with conductive contacts 25.

Referring to FIG. 1C, another cross-sectional view of the virtual ground flash array layout taken along line Y–Y' in FIG. 1A is shown. Isolation devices 32 formed by the conventional methods, such as local oxide oxidation (LOCOS), are in the semiconductor substrate 20. The semiconductor substrate 20 may have a single-well or multi-well configuration (not shown) therein. The isolation devices 32 used as buried diffusion oxide are arranged parallel to the isolation devices 22 (STI) in FIG. 1B. To be specific, the conductive structures 24 in FIG. 1B are also interposed among the dummy polysilicon lines 36. As it turns out, each conductive structure 24 is surrounded and isolated by the isolation devices 22 in FIG. 1B and the dummy polysilicon lines 36 in FIG. 1C. The correspondence of the isolation devices 22 and the dummy polysilicon lines 36 can prevent the conductive structures 24 from short effect resulting from N+ buried diffusion regions 34.

Furthermore, the N+ diffusion region 35 underlies the conductive structure 24. To be specific, the conductive contacts 25 are above the N+ diffusion regions 35 instead of the buried N+ diffusion regions 34. The conductive contacts 25 connected to the N+ diffusion regions 35 through the conductive structure 24 can reduce some risks resulted from conventional opening formation of contacts by etching buried diffusion oxide (isolation devices 32). Furthermore, dummy polysilicon lines 36 and word lines 37 are on the isolation devices 32. The dummy polysilicon lines 36, formed together with the word lines 37, have null memory function owing to extension of the isolation devices 22 (STI) thereunder. For the isolation of the buried diffusion regions, it is worthy of the null memory function of the dummy polysilicon lines 36 because the extension of the isolation devices 22 may influence on memory function of the word line.

It is an object of the present invention to provide a memory cell device enabling to be manufactured by the general CMOS self-aligned salicide process. The addition of isolation devices and dummy lines can prevent buried diffusion regions from short resulted from the general salicide formation.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory array fabricated by salicide process of complementary metal-oxide-semiconductor, said memory array comprising:

a semiconductor substrate;

a plurality of first isolation devices aligned in said semiconductor substrate;

a plurality of second isolation devices aligned on said semiconductor substrate, the alignment of said second isolation devices parallel to one of said first isolation devices;

a plurality of polysilicon lines on said second isolation devices therefor have null memory function;

a conductive structure below a surface of said semiconductor substrate, said conductive structure between said first isolation devices; and a conductive contact on said conductive structure.

2. The memory array of claim 1 further comprising a plurality of word lines outside said polysilicon lines and on said second isolation devices.

3. The memory array of claim 1, wherein said semiconductor substrate comprises a plurality of buried diffusion regions underlying said second isolation devices.

4. The memory array of claim 1, wherein said first isolation devices are shallow trench isolation structures.

5. The memory array of claim 1, wherein said second isolation devices are formed by local oxide oxidation method.

6. The memory array of claim 1, wherein said conductive structure is formed by self-aligned salicide process of complementary metal-oxide-semiconductor.

7. The memory array of claim 1, wherein said semiconductor substrate comprises a diffusion region underlying said conductive structure.

* * * * *